(12) United States Patent
Lu

(10) Patent No.: US 8,370,526 B2
(45) Date of Patent: Feb. 5, 2013

(54) BINARY-SHIFT OPERATIONS SUCH AS FOR HEADER COMPRESSION IN PACKET-BASED COMMUNICATIONS

(75) Inventor: Xiaomin Lu, Austin, TX (US)

(73) Assignee: LSI Corporation, Milpitas, CA (US)

( * ) Notice: Subject to any disclaimer, the term of this patent is extended or adjusted under 35 U.S.C. 154(b) by 152 days.

(21) Appl. No.: 13/032,148

(22) Filed: Feb. 22, 2011

(65) Prior Publication Data

US 2012/0215939 A1    Aug. 23, 2012

(51) Int. Cl.
*G06F 15/16* (2006.01)
(52) U.S. Cl. .................. 709/247; 709/231; 709/232
(58) Field of Classification Search .......... 709/231, 709/232, 247
See application file for complete search history.

(56) References Cited

U.S. PATENT DOCUMENTS

| | | | |
|---|---|---|---|
| 6,882,217 B1 * | 4/2005 | Mueller | 330/2 |
| 7,424,546 B1 * | 9/2008 | Aweya et al. | 709/232 |
| 7,679,550 B2 * | 3/2010 | Garrison et al. | 342/357.29 |
| 2009/0023404 A1 * | 1/2009 | Leinonen et al. | 455/114.2 |
| 2009/0172069 A1 | 7/2009 | Avss et al. | |
| 2010/0208798 A1 | 8/2010 | Melpignano et al. | |
| 2010/0278196 A1 | 11/2010 | Kapoor et al. | |
| 2012/0215939 A1 * | 8/2012 | Lu | 709/247 |

FOREIGN PATENT DOCUMENTS

EP    1414474 B1    6/2006

OTHER PUBLICATIONS

Pelletier, G. et al., "RObust Header Compression Version 2 (ROHCv2): Profiles for RTP, UDP, IP, ESP and UDP-Lite," Network Working Group, Request for Comments: 5225, Apr. 2008, pp. 1-124.
Bormann, C. et al., "RObust Header Compression (ROHC): Framework and four profiles: RTP, UDP, ESP, and uncompressed," Network Working Group, Request for Comments: 3095, Jul. 2001, pp. 1-168.
Markstein, Peter., "Software Division and Square Root Using Goldschmidt's Algorithms," Proceedings of the 6th Conference on Real Numbers and Computers (RNC'6), Dagstuhl, Germany, 2004, pp. 146-157.
Oberman, Stuart F. et al., "Division Algorithms and Implementations," IEEE Transactions on Computers vol. 46, No. 8, Aug. 1997, pp. 833-854.
Nenadic, Nikola M. et al., "Fast Division on Fixed-Point DSP Processors Using Newton-Raphson Method," in Proc. EUROCON 2005, vol. 1, pp. 705-708.
"An introduction to IP Header Compression," www.effnet.com, Feb. 2004, [retrieved on Feb. 7, 2011]. Retrieved from the Internet: <URL: http://www.effnet.com/sites/effnet/pdf/uk/Whitepaper_Header_Compression.pdf> (13 pages).

* cited by examiner

*Primary Examiner* — Michael Won
(74) *Attorney, Agent, or Firm* — Mendelsohn, Drucker & Associates, P.C.; Yuri Gruzdkov; Steve Mendelsohn

(57) ABSTRACT

In one embodiment of a header-compression method, a timestamp value is divided by a stride value using a plurality of binary-shift operations corresponding to a Taylor expansion series of the reciprocal stride value in a base of $\frac{1}{2}$. When the division-logic circuitry of an arithmetic logic unit in the corresponding communication device is not designed to handle operands that can accommodate the length of the timestamp and/or stride values, the header-compression method can advantageously be used to improve the speed and efficiency of timestamp compression in communication devices.

20 Claims, 7 Drawing Sheets

200

500

700

US 8,370,526 B2

BINARY-SHIFT OPERATIONS SUCH AS FOR HEADER COMPRESSION IN PACKET-BASED COMMUNICATIONS

CROSS-REFERENCE TO RELATED APPLICATIONS

The subject matter of this application is related to that of U.S. Patent Application Publication No. 2012/0215824, which is incorporated herein by reference in its entirety.

BACKGROUND

1. Field of the Invention

The present invention relates generally to communication equipment and, more specifically but not exclusively, to header-compression modules of network nodes in packet-based communication systems.

2. Description of the Related Art

This section introduces aspects that may help facilitate a better understanding of the invention(s). Accordingly, the statements of this section are to be read in this light and are not to be understood as admissions about what is in the prior art or what is not in the prior art.

Header compression is a process of compressing a packet header before transmitting the corresponding packet over a communication link and then decompressing the header to its original state upon reception at the remote end of the link. Header compression is typically possible because header fields of different packets of the same packet stream have redundant information. For example, by observing the fields that remain constant or change in specific patterns, the transmitter can either omit these fields in some packets or represent these fields in fewer bits compared to the original size.

In data-streaming applications that operate in accordance with Internet Protocol (IP) version 4 or version 6, the combined IP/UDP (User Datagram Protocol)/RTP (Real-time Transport Protocol) header size is 40 or 60 bytes, respectively. For Voice over IP (VoIP), these sizes may correspond to about 60% of the total amount of data sent over the communication link. While the overhead of this size may be tolerable on wired links, it is usually deemed excessive for wireless links where the bandwidth is a scarce resource. Therefore, an efficient compressor that is able to reduce the header size from 40 or 60 bytes down to several (e.g., one to three) bytes is an extremely useful component to have on communication links with a limited bandwidth capacity.

SUMMARY

Disclosed herein are various embodiments of a header-compression method, in which a timestamp value is divided by a stride value using a plurality of binary-shift operations corresponding to a Taylor expansion series of the reciprocal stride value in a base of ½. When the division-logic circuitry of an arithmetic logic unit in the corresponding communication device is not designed to handle operands that can accommodate the length of the timestamp and/or stride values, embodiments of the header-compression method can advantageously be used to improve the speed and efficiency of timestamp compression in communication devices.

According to one embodiment, provided is an apparatus having an instruction memory and a processing module. Using a sequence of instructions from the instruction memory, the processing module is configured to (i) generate a first partial quotient and a first residual using a first plurality of binary-shift operations, each applied to a first operand, wherein each of said binary-shift operations corresponds to a term in a Taylor expansion series of a reciprocal second operand in a base of ½, and (ii) generate a true quotient for a division operation, in which the first operand is the dividend and the second operand is the divisor, based on the first partial quotient.

According to another embodiment, provided is a machine-implemented method of processing data, the method having the steps of (i) the machine generating a first partial quotient and a first residual using a first plurality of binary-shift operations, each applied to a first operand, wherein each of said binary-shift operations corresponds to a term in a Taylor expansion series of a reciprocal second operand in a base of ½, and (ii) the machine generating a true quotient for a division operation, in which the first operand is the dividend and the second operand is the divisor, based on the first partial quotient.

BRIEF DESCRIPTION OF THE DRAWINGS

Other aspects, features, and benefits of various embodiments of the invention will become more fully apparent, by way of example, from the following detailed description and the accompanying drawings, in which.

DETAILED DESCRIPTION

An M/N-bit division operation involves an M-bit dividend being divided by an N-bit divisor, where M and N are positive integers, $N \leq M$. According to various embodiments, an M/N-bit division operation can be implemented using a plurality of iterative P/Q-bit division operations, where P and Q are positive integers, $P \leq M$, $Q<P$, and $Q<N$. In a representative iterative step, the remainder resulting from the previous P/Q-bit division operation and the dividend of the original M/N-bit division operation are used to form the dividend for the next P/Q-bit division operation.

As defined in Federal Standard 1037C, an arithmetic shift is a shift, applied to the representation of a number in a fixed radix numeration system and in a fixed-point representation system, and in which only the characters representing the fixed-point part of the number are moved. An arithmetic shift is usually equivalent to multiplying the number by a positive or a negative integral power of the radix, except for the effect of any rounding. In an arithmetic shift, the values that are shifted out of either end of the operand are discarded. In a left arithmetic shift, zeros are shifted in on the right. In a right arithmetic shift by one position, the sign bit is shifted in on the left, thus preserving the sign of the operand. In a right arithmetic shift by more than one position, the additional empty spaces are filled up with a copy of the most-significant bit (MSB).

An arithmetic shift should be distinguished from a logical shift. Unlike an arithmetic shift, a logical shift does not preserve a number's sign bit or distinguish a number's exponent from its mantissa. Rather, every bit in the operand is simply moved a given number of bit positions, and the vacant bit-positions are filled in with zeros. A logical shift is often viewed as an operation in which the operand is being treated as a sequence of bits rather than as a number. Binary logical shifts can be used to efficiently implement the multiplication or division of unsigned integers by powers of two. For example, a logical shift left by n bits applied to a signed or unsigned binary number has the effect of multiplying that number by $2^n$. A logical shift right by n bits applied to an unsigned binary number has the effect of dividing that number by $2^n$ and rounding down to zero the bits that have shifted out of the operand.

As used herein, the term "binary-shift operation" may refer to either an arithmetic-shift operation or a logical-shift operation applied to a binary value. One skilled in the art will readily understand which of the two types of shifts is appropriate for use with the particular processor architecture, programming language, etc.

Figure 1:
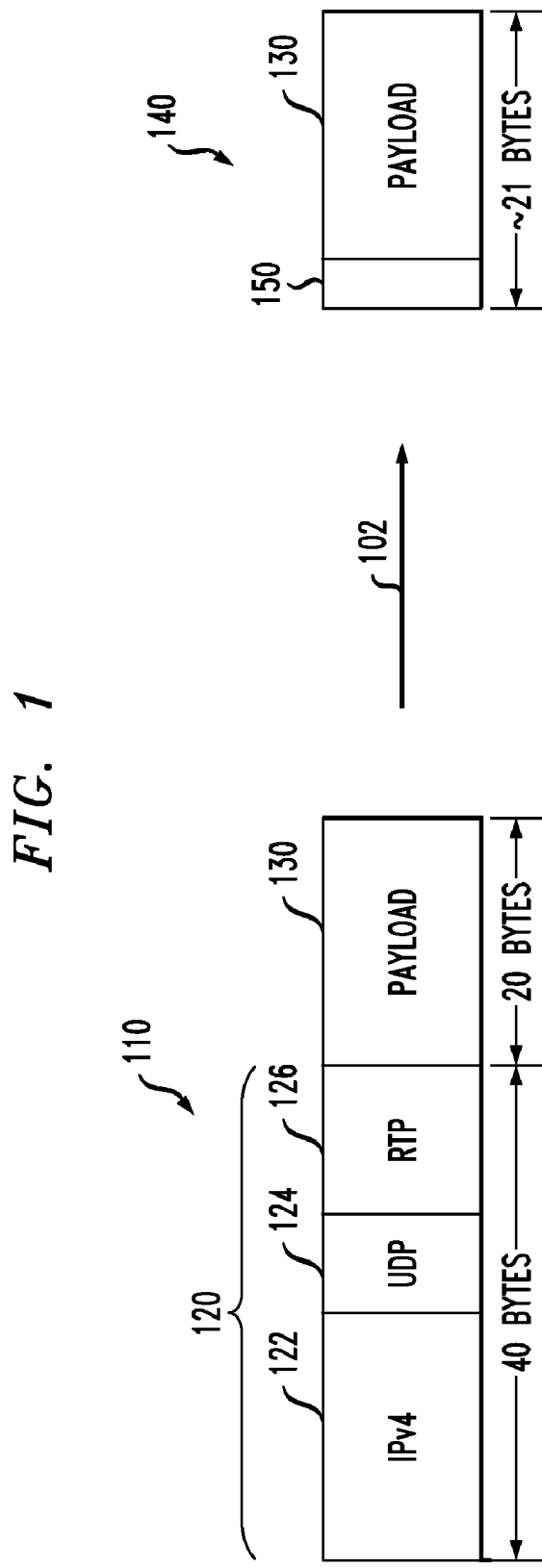
FIG. 1 schematically shows a header-compression operation according to one embodiment.

FIG. 1 schematically shows a header-compression operation 102 according to one embodiment. More specifically, a header-compression module that performs header-compression operation 102 transforms a data packet 110 having a packet header 120 into a data packet 140 having a compressed packet header 150. Note that the transformation does not change a payload portion 130, thereby causing both of data packets 110 and 140 to have the same payloads.

Packet header 120 is illustratively shown as having a size of 40 bytes and comprising an IPv4 (Internet Protocol version 4) portion 122, a UDP (User Datagram Protocol) portion 124, and an RTP (Real-time Transport Protocol) portion 126. IPv4 portion 122 has a size of 20 bytes; UDP portion 124 has a size of 8 bytes; and RTP portion 126 has a size of 12 bytes. From the description that follows, one of ordinary skill in the art will also understand how to use various embodiments on header types and/or sizes that are different from those of packet header 120.

RTP portion 126 of packet header 120 serves to support end-to-end network-transport functions for applications that transmit real-time data, such as audio and/or video. In a representative configuration, a transmitter encodes real-time data received from a corresponding application and uses the encoded data to form a sequence of payload portions 130. Each payload portion 130 is provided with a corresponding packet header 120 whose RTP portion 126 contains an appropriate timestamp and a sequence number that reflect the position of that payload portion in the sequence. A receiver then uses RTP portions 126 to arrange the received data packets in proper order, detect missing data packets, and help the corresponding application to reconstruct the original real-time data.

The timestamp of RTP portion 126 is 32 bits long and reflects the sampling instant of the first octet in the corresponding payload portion 130. The sampling instant is derived from a clock that increments monotonically and linearly in time to allow synchronization and jitter calculations. The resolution of the clock is usually chosen to be sufficient for the desired synchronization accuracy and jitter quantification. If payload portions 130 are generated periodically, then, from packet to packet, the RTP timestamp is incremented by a fixed value that is often referred to as "stride." The stride depends on the sampling rate and the time interval corresponding to each payload portion 130. For example, for payload portions 130 carrying 20 ms of audio sampled at 8 kHz, the stride is 160 (=20 ms×8 kHz). For payload portions 130 carrying video having a frame rate of 30 frames per second and sampled at 90 kHz, the stride is 3,000 (=1/30s×90 kHz). One skilled in the art will understand that other stride values are also possible. Furthermore, when "gettimeofday( )" function calls are used by the corresponding application to generate the RTP timestamps, the stride may change over time. A typical "gettimeofday( )" function returns the current time, expressed in seconds and/or microseconds and measured with respect to a reference time point often referred to as the "epoch." The granularity of the function is usually related to the resolution of the system clock.

In one embodiment, packet header 120 is transformed into compressed packet header 150 in accordance with a Robust Header Compression (ROHC) standard. Two versions of the ROHC standard are described, e.g., in Network Working Group's documents RFC 3095 and RFC 5225, respectively, both of which documents are incorporated herein by reference in their entirety. Both versions of ROHC require the timestamp compression to be implemented based on either scaled timestamp encoding or timer-based timestamp encoding. Both of these encoding schemes scale the timestamp value using the stride value as a scaling factor, thereby causing compressed packet header 150 to use fewer than 32 bits to carry the timestamp information. Also, for certain data packets, the timestamp can be completely compressed away, resulting in no timestamp bits being sent to the receiver.

The timestamp-scaling operation can be performed using a division of the original timestamp value (32 bits) by the stride value (16 or 8 bits). However, one problem with network processors that handle the data plane of the communication system is that they are designed as highly specialized units. As a result, such a network processor might not have an arithmetic logic unit (ALU) designed for performing 32/16-bit and/or 32/8-bit division operations as hardware instructions that are part of its Instruction Set Architecture (ISA), e.g., as further explained below in reference to FIG. 7.

When specialized 32/16-bit and/or 32/8-bit division-logic circuitry is not available in the ALU, the processor usually implements the required division operation using a general-purpose division algorithm that the ALU can execute with the logic circuitry that it has. The evident downside of this implementation is that it tends to be very expensive in terms of the number of CPU cycles per division operation. Embodiments disclosed herein address this problem by providing a set of division algorithms that can be used to implement RTP-timestamp encoding in a relatively efficient manner, e.g., when the ALU of a network processor has the capability of efficiently handling a 16/8-bit division operation, but not a 32/16-bit or 32/8-bit division operation. As further explained below, the provided division algorithms can be used to reduce any one of 32/16, 32/8, 24/16, 24/8, and 16/16-bit division operations to a corresponding set of 16/8-bit division operations. Since the ALU can execute a 16/8-bit division operation in a very efficient manner, the speed and efficiency of ROHC timestamp compression in communication devices can advantageously be improved compared to those achieved in the prior art.

Figure 2:
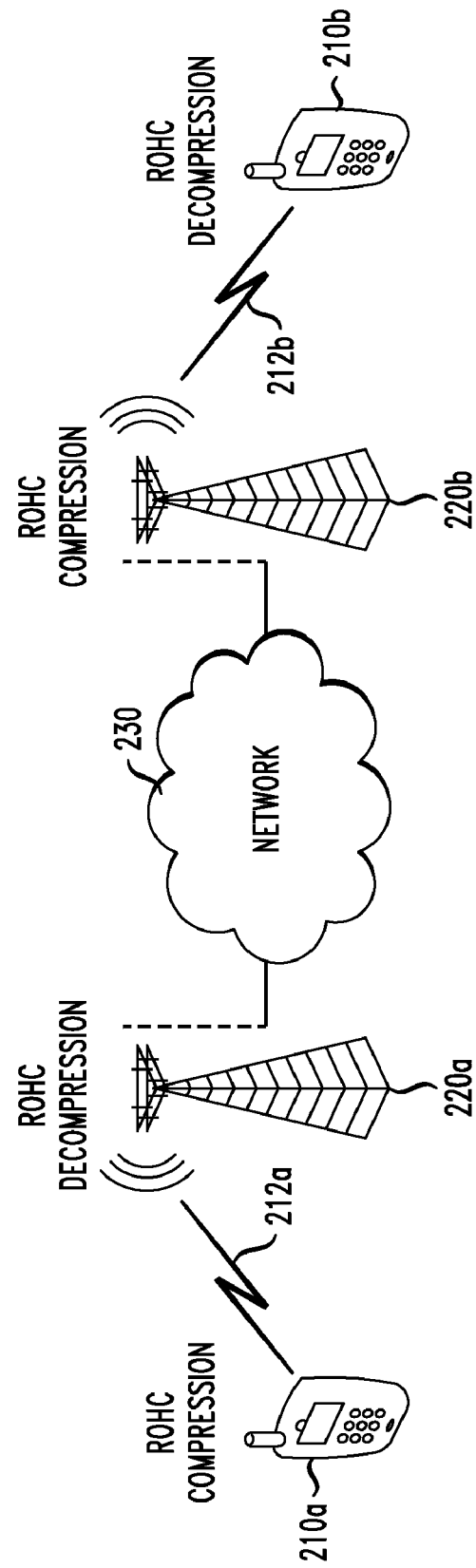
FIG. 2 shows a block diagram of a communication system in which various embodiments can be practiced.

FIG. 2 shows a block diagram of a communication system 200 in which various embodiments can be practiced. System 200 is illustratively shown as having two access terminals 210a-b, each connected via a corresponding one of wireless links 212*a-b* to a corresponding one of base stations 220*a-b*. Base stations 220*a-b* are connected to one another via a wired IP network 230, thereby providing end-to-end connectivity for access terminals 210*a-b*, e.g., for transmitting real-time audio and/or video data.

Each of access terminals 210*a-b* and base stations 220*a-b* has a respective ROHC header-compression module (not explicitly shown in FIG. 2). Depending on the direction of the packet traffic, the ROHC header-compression module performs either a header-compression operation 102 shown in FIG. 1 or a corresponding reverse (header-decompression) operation. For example, for the packet traffic flowing from access terminal 210*a* to access terminal 210*b*, the following operations are performed. The ROHC header-compression module of access terminal 210*a* performs a header-compression operation 102 and transmits the compressed-header packet to base station 220*a* via wireless link 212*a*. The ROHC header-compression module of base station 220*a* then performs a corresponding header-decompression operation and transmits the decompressed-header packet to base station 220*b* via wired IP network 230. After base station 220*b* receives, over wired IP network 230, the corresponding data packet 110 from base station 220*a*, the ROHC header-compression module of base station 220*b* performs another header-compression operation 102 and transmits the compressed-header packet to access terminal 210*b* via wireless link 212*b*. Finally, the ROHC header-compression module of access terminal 210*b* performs a corresponding header-decompression operation. Access terminal 210*b* then uses RTP portions 126 of the resulting decompressed headers 120 to reconstruct the original real-time data transmitted by access terminal 210*a*.

In various embodiments, each access terminal 210 may be any suitable wireless device, such as a cell phone, a laptop computer, a wireless-communication card, a personal digital assistant (PDA), or a modem. Different access terminals 210 may be mobile or stationary, with the corresponding communication system having more than two access terminals. Similarly, each base station 220 may be any suitable base-station transceiver, such as a cellular base station, an access server, an access point, a Node B, or a Modem Pool Transceiver (MPT). One skilled in the art will appreciate that various embodiments may also be practiced on various types of links that differ from wireless links 212, such as wired links, fiber-optic links, and coaxial-cable links.

The use of header compression in communication system 200 may provide one or more of the following benefits/advantages: (1) shorter interactive response times due to smaller packet sizes; (2) lower probability of packet loss due to fewer bit errors on links 212; (3) better utilization of the radio spectrum due to smaller packet sizes and/or fewer bit errors; (4) bandwidth savings due to lower packet-header overhead; and (5) decrease in the infrastructure cost per user due to better bandwidth utilization.

Figure 3:
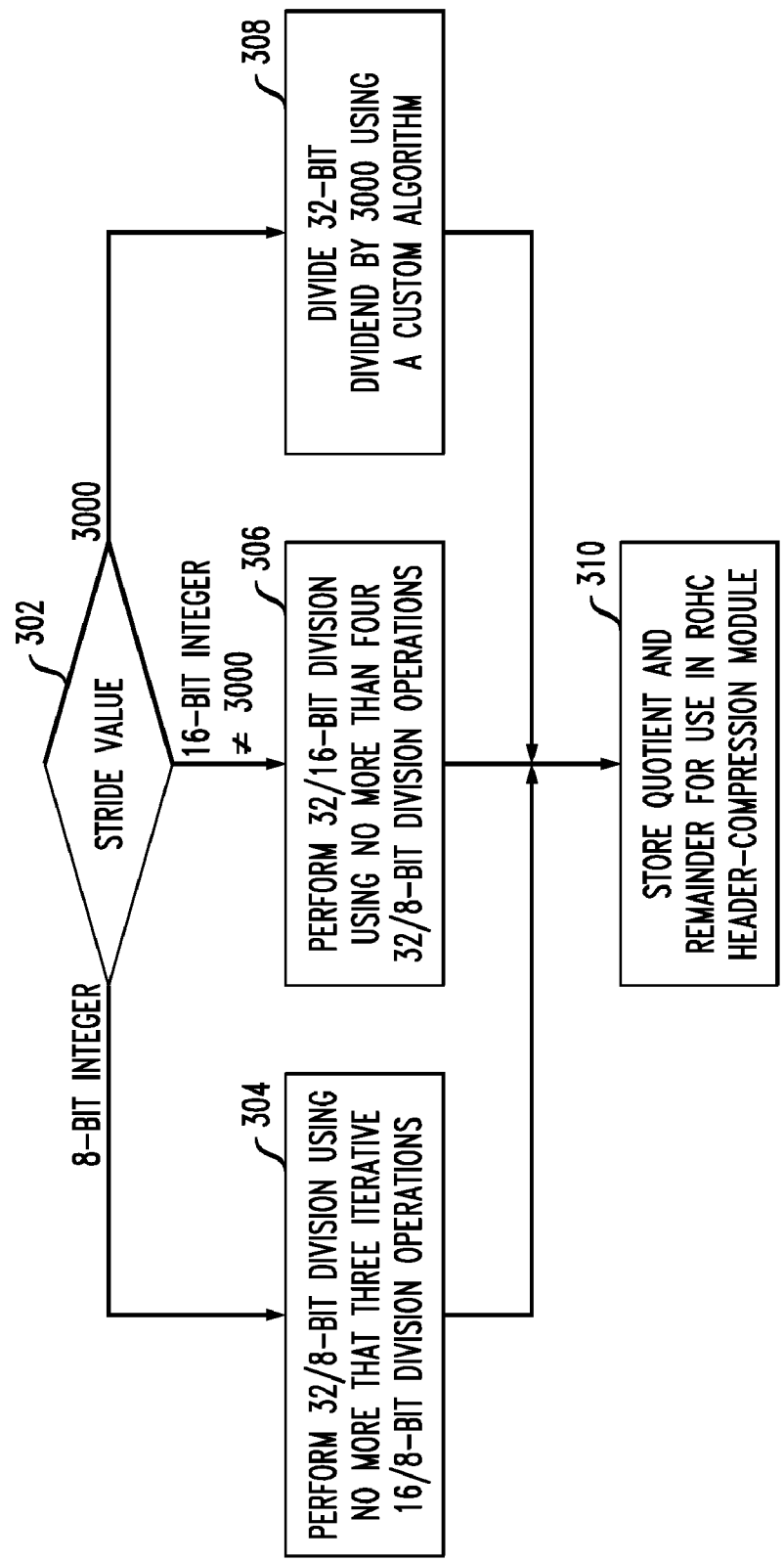
FIG. 3 shows a flowchart of a division method that can be used to compress RTP (Real-time Transport Protocol) timestamps according to one embodiment.

FIG. 3 shows a flowchart of a division method 300 that can be used to compress RTP timestamps according to one embodiment. More specifically, method 300 provides a set of division algorithms that can be used to efficiently implement 32/16-bit and 32/8-bit division operations on the limited computational resources of the ALUs used in communication devices, such as access terminals 210 and base stations 220 of system 200 (FIG. 2). Depending on the type of data traffic (e.g., audio or video) and/or the stride value, method 300 invokes a corresponding appropriate division algorithm that enables the ALU to complete the required division operation in a relatively small number of clock cycles. Method 300 can be used, e.g., to implement various ROHC header-compression modules in system 200.

At step 302 of method 300, the stride value is examined to select an appropriate division algorithm. Note that the timestamp and stride values serve as the dividend and divisor, respectively, in the invoked division algorithm. Three different types of stride values are recognized at step 302. The first type includes 8-bit unsigned integers that occur, e.g., in narrowband audio (e.g., voice) traffic, in which payload portion 130 carries 10, 20, or 30-ms worth of audio data. The second type consists of a single value (=decimal 3000) that occurs, e.g., in video traffic. The third type includes 16-bit unsigned integers that are neither 3000 nor have eight zeros in the eight MSB (most-significant bit) positions. These values occur, e.g., in wideband audio/video traffic and in applications that use "gettimeofday( )" function calls for time-stamping.

If the stride value is an 8-bit integer, then the processing of method 300 is directed from step 302 to step 304. Step 304 executes a division algorithm in which a 32-bit RTP timestamp (dividend) is divided by an 8-bit stride (divisor) using no more than three iterative 16/8-bit division operations. Representative embodiments of step 304 are described in more detail below in reference to FIG. 4.

If the stride value is a 16-bit integer different from 3000, in which the eight most-significant bits are not all zeros, then the processing of method 300 is directed from step 302 to step 306. Step 306 executes a division algorithm in which a 32-bit RTP timestamp (dividend) is divided by a 16-bit stride (divisor) using no more than four iterative 32/8-bit division operations. Each of these 32/8-bit division operations can be carried out in a manner similar to that of step 304. Representative embodiments of step 306 are described in more detail below in reference to FIG. 5.

If the stride value is 3000, then the processing of method 300 is directed from step 302 to step 308. Step 308 executes a division algorithm in which a 32-bit RTP timestamp (dividend) is divided by 3000 (divisor). Note that 3000 is a 12-bit binary integer (=101110111000). As a result, step 308 represents a case of the 32/12-bit division. In one implementation, this division can be reduced to four 32/8-bit division operations using an approach similar to that used at step 306. In an alternative implementation, this division can be based on a custom algorithm designed for the divisor value of 3000. Representative embodiments of step 308 are described in more detail below in reference to FIGS. 5 and 6.

At step 310, the quotient and remainder calculated at the corresponding one of steps 304-308 are stored in the memory for further use by appropriate functional blocks of the ROHC header-compression module. For example, in one configuration, the quotient may be transmitted in compressed header 150 of data packet 140 (see FIG. 1). Provided that an intended receiver "knows" the stride value, e.g., from a prior data-packet exchange with the transmitter, the receiver can then obtain a sufficiently accurate estimate of the timestamp value by calculating a product of the received quotient and the stride value.

Figure 4:
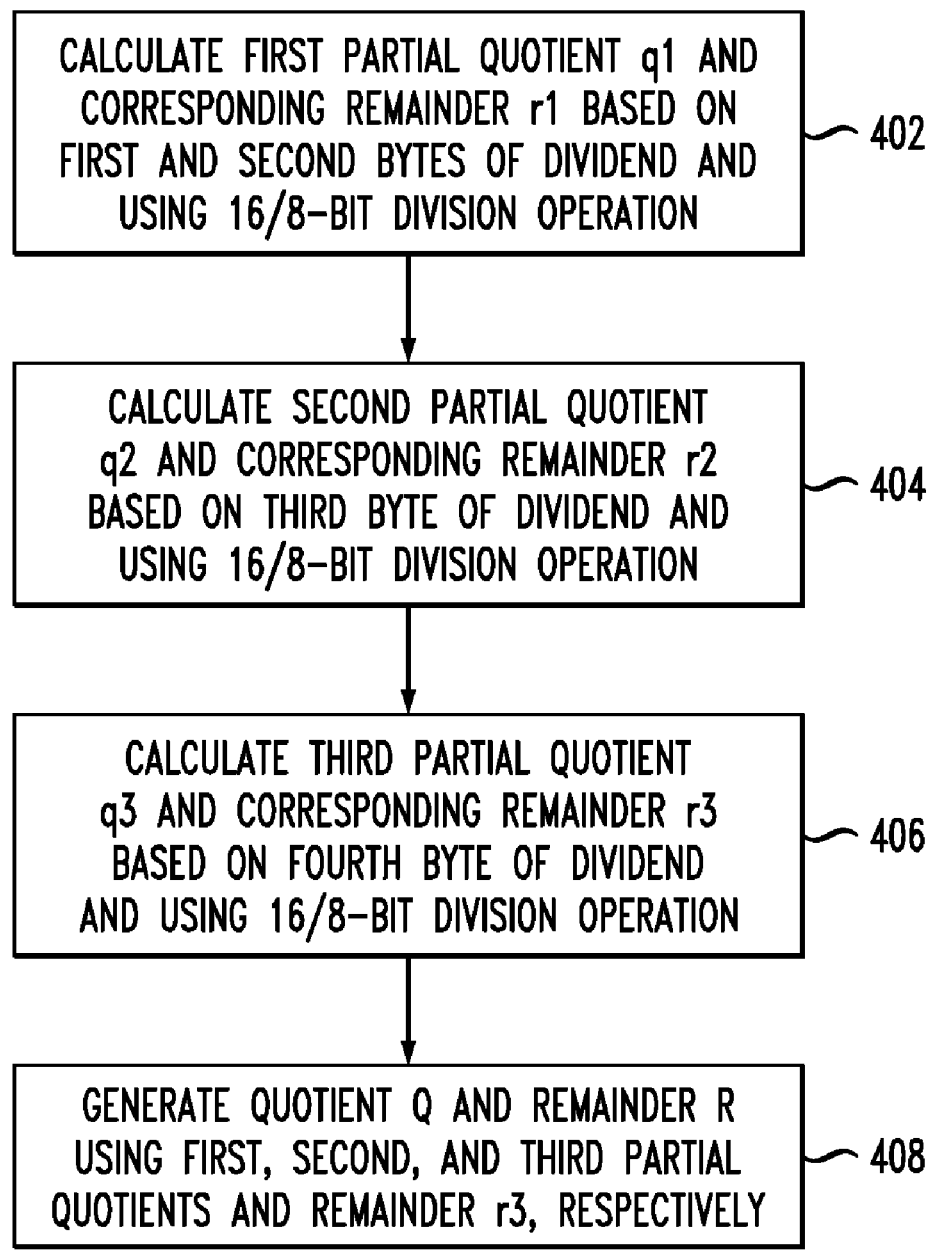
FIG. 4 shows a flowchart of a division method that can be used to implement a 32/8-bit division operation in the method shown in FIG. 3 according to one embodiment.

FIG. 4 shows a flowchart of a division method 400 that can be used to implement step 304 of method 300 according to one embodiment. More specifically, method 400 reduces a 32/8-bit division operation to three or fewer iterative 16/8-bit division operations. As already indicated above, the 16/8-bit division may be readily available in the form of a hardware (HW) instruction on ALUs of various communication devices, whereas the 32/8-bit division might not be and, as such, is typically implemented using a corresponding generic division algorithm, such as the generic Restoring Division Algorithm, which is well known to those of ordinary skill in the art. Since method 400 enables the ALU to retire (i.e., dispose of) 8 bits of the dividend per iteration, which is significantly more than only one bit per iteration for the generic division algorithm, method 400 can advantageously be used to significantly increase the speed and efficiency of header-compression modules in communication devices.

Method 400 receives, as an input, a 32-bit dividend (X) and an 8-bit divisor (d). Dividend X can be expressed as a concatenation of four one-byte unsigned integers, for example, as shown in Eq. (1):

$$X=(x_1,x_2,x_3,x_4)=x_1\times2^{24}+x_2\times2^{16}+x_3\times2^8+x_4 \quad (1)$$

As an output, method 400 generates the "true" quotient (Q) and remainder (R) that satisfy Eq. (2):

$$X=Qd+R \quad (2)$$

where $0\leq R\leq d$.

At step 402 of method 400, the ALU is configured to calculate a first partial quotient ($q_1$) and a corresponding remainder ($r_1$) that satisfy Eq. (3):

$$(x_1,x_2)=q_1d+r_1 \quad (3)$$

where $(x_1, x_2)$ is a binary value formed by concatenation of the first and second bytes of the dividend (also see Eq. (1)). It can be mathematically proven that first partial quotient $q_1$ is a 16-bit integer, and remainder $r_1$ is an 8-bit integer, where $0\leq r_1<d$. Since Eq. (3) expresses a 16/8-bit division operation, the corresponding calculation can be performed using a single corresponding HW instruction.

At step 404, the ALU is configured to calculate a second partial quotient ($q_2$) and a corresponding remainder ($r_2$) that satisfy Eq. (4):

$$(r_1,x_3)=q_2d+r_2 \quad (4)$$

where $(r_1,x_3)$ is a binary value formed by concatenation of remainder $r_1$ and the third byte of the dividend (see Eqs. (1) and (3)). It can be mathematically proven that second partial quotient $q_2$ is a 16-bit integer, and remainder $r_2$ is an 8-bit integer, where $0\leq r_2<d$. Similar to Eq. (3), Eq. (4) expresses a 16/8-bit division operation, and the corresponding calculation can be performed using a single corresponding HW instruction.

At step 406, the ALU is configured to calculate a third partial quotient ($q_3$) and a corresponding remainder ($r_3$) that satisfy Eq. (5):

$$(r_2,x_4)=q_3d+r \quad (5)$$

where $(r_2, x_4)$ is a binary value formed by concatenation of remainder $r_2$ and the fourth byte of the dividend (see Eqs. (1) and (4)). It can be mathematically proven that third partial quotient $q_3$ is a 16-bit integer, and remainder $r_3$ is an 8-bit integer, where $0\leq r_3<d$. Similar to Eqs. (3)-(4), Eq. (5) expresses a 16/8-bit division operation, and the corresponding calculation can be performed using a single corresponding HW instruction.

At step 408, the ALU is configured to generate true quotient Q and remainder R (see Eq. (2)) in accordance with Eqs. (6):

$$Q=q_1\times2^{16}+q_2\times2^8+q_3 \quad (6a)$$

$$R=r_3 \quad (6b)$$

where $q_1$, $q_2$, and $q_3$ are the three partial quotients calculated at steps 402-406, respectively, and $r_3$ is the remainder calculated at step 406.

In one implementation, a 16/8-bit division operation includes two separate and independent sub-operations: (i) a quotient-calculation sub-operation and (ii) a modulo sub-operation. With certain processors, e.g., having two ALU units, these two sub-operations can be executed in parallel with one another, thereby reducing the time needed to complete each 16/8-bit division operation. Since method 400 includes multiple 16/8-bit division operations, such parallelization can be used to further increase the speed and efficiency of the corresponding header-compression module compared to those achieved in the prior art. Various suitable 16/8-bit division algorithms and their HW implementations are reviewed, e.g., in an article by S. F. Oberman and M. J. Flynn entitled "Division Algorithms and Implementations," published in IEEE Transactions on Computers, 1997, vol. 46, No. 8, pp. 833-854, which article is incorporated herein by reference in its entirety.

In one embodiment, method 400 can be modified to include an additional step of determining the MSB position ($p_{MSB}$) in dividend X. For example, this additional step can precede step 402 and be implemented to take up a single clock cycle. Using the notation in which bit positions are numbered in the ascending order starting from the least-significant bit (position number 0), the following modifications can be made to the processing flow of method 400 shown in FIG. 4.

If $p_{MSB}\geq24$, then the processing flow of method 400 remains unchanged.

If $24>p_{MSB}\geq16$, then the processing flow of method 400 can be changed as follows. Dividend X is expressed using Eq. (7) instead of Eq. (1):

$$X=(0,x_1,x_2,x_3)=x_1\times2^{16}+x_2\times2^8+x_3 \quad (7)$$

Step 406 is omitted. Step 408 is modified to use Eqs. (8) instead of Eqs. (6):

$$Q=q_1\times2^8+q_2 \quad (8a)$$

$$R=r_2 \quad (8b)$$

If $16>p_{MSB}\geq8$, then the processing flow of method 400 is changed as follows. Dividend X is expressed using Eq. (9) instead of Eq. (1):

$$X=(0,0,x_1,x_2)=x_1\times2^8+x_2 \quad (9)$$

Steps 404 and 406 are omitted. Step 408 is modified to use Eqs. (10) instead of Eqs. (6):

$$Q=q_1 \quad (10a)$$

$$R=r_1 \quad (10b)$$

One skilled in the art will appreciate that these modifications can advantageously be used to increase the speed and efficiency of the corresponding header-compression modules when timestamp values are relatively small.

Figure 5:
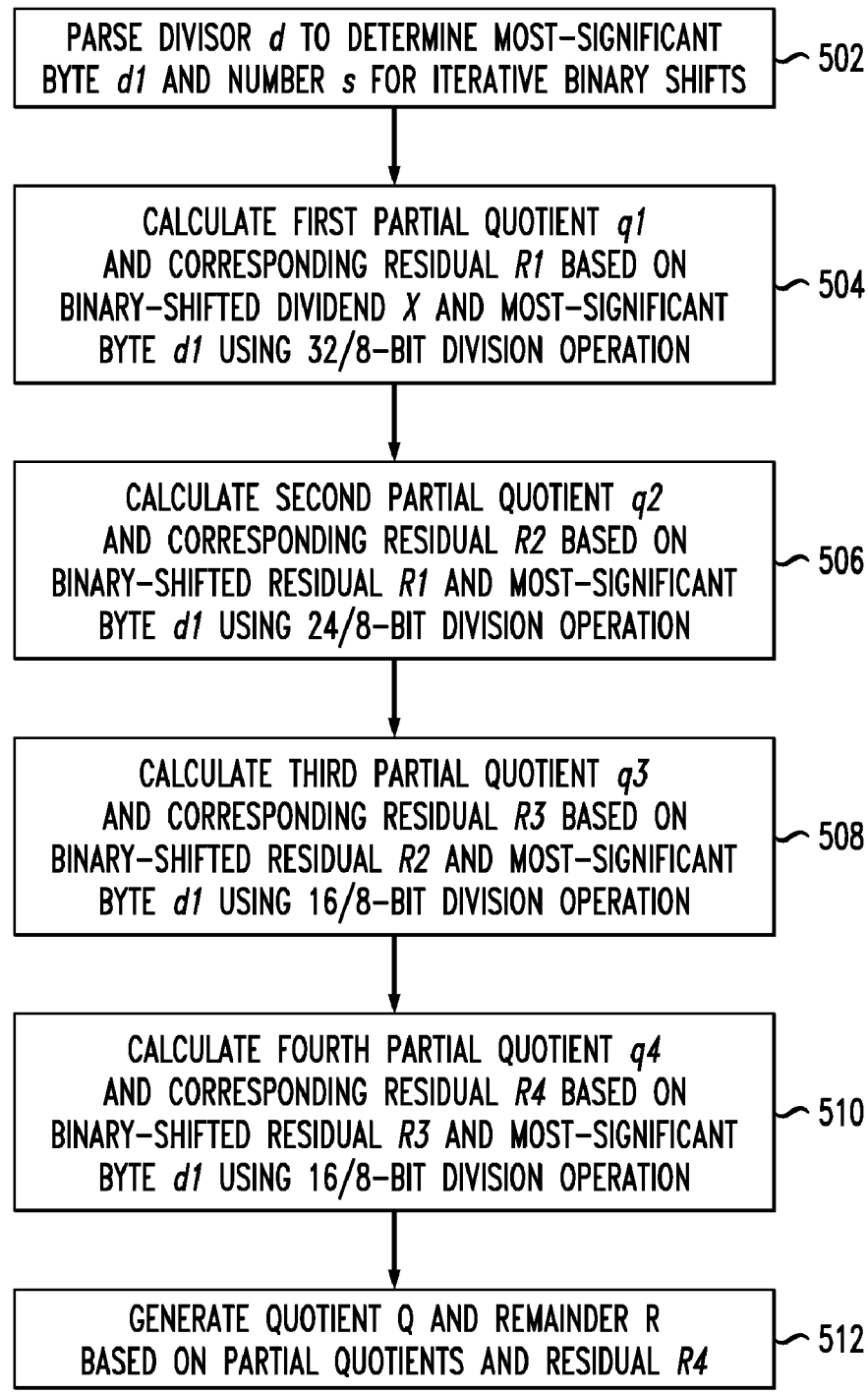
FIG. 5 shows a flowchart of a division method that can be used to implement a 32/16-bit division operation in the method shown in FIG. 3 according to one embodiment.

FIG. 5 shows a flowchart of a division method 500 that can be used to implement step 306 of method 300 according to one embodiment. More specifically, method 500 reduces a 32/16-bit division operation to four or fewer iterative division operations, each of which can be implemented using a 32/8-bit division operation. In one embodiment, each of the 32/8-bit division operations is performed using method 400. Similar to method 400, method 500 enables the ALU to retire 8 bits of the dividend per iteration.

Method 500 receives, as an input, a 32-bit dividend (X) and a 16-bit divisor (d). As an output, method 500 generates true quotient Q and remainder R that satisfy Eq. (2).

At step 502 of method 500, divisor d is parsed to determine its most-significant byte ($d_1$), the number (s, shift number) of bits that follow $d_1$ in the divisor, and the residual ($d_2$). Most-significant byte $d_1$ is determined by (i) finding the most-significant bit of divisor d having a value of one and (ii)

selecting that most-significant bit and the next seven bits that follow the most-significant bit to form $d_1$. Residual $d_2$ is determined by removing from divisor d the bits corresponding to most-significant byte $d_1$ and also any zeros that precede the most-significant byte in the 16-bit format of the divisor. Shift number s is determined by counting the number of bits in residual $d_2$. It is clear from this description that $d_1$, $d_2$, and s satisfy Eq. (11):

$$d = d_1 \times 2^s + d_2 \quad (11)$$

For example, for d=9876 (=binary 00100110 10010100), most-significant byte $d_1$ is 10011010 (=decimal 154), and shift number s is 6.

At step 504, the ALU is configured to calculate a first partial quotient ($q_1$) and a corresponding residual ($R_1$) that satisfy Eq. (12):

$$X = q_1 d + R_1 \quad (12)$$

This calculation is performed using the following sub-steps.

In a first sub-step, first partial quotient $q_1$ is calculated using Eq. (13):

$$q_1 = \frac{X^{(>>s)}}{d_1 + 1} \quad (13)$$

where $X^{(>>s)}$ denotes the binary value obtained by applying a binary "shift-right by s positions" operation to dividend X. If $d_1 < 255$, then Eq. (13) expresses a 32/8-bit division operation, which can be performed, e.g., using an appropriate embodiment of method 400. If $d_1 = 255$, then the calculation corresponding to Eq. (13) can be implemented using a binary shift-right operation expressed by Eq. (14):

$$q_1 = X^{(>>s+8)} \quad (14)$$

In a second sub-step, residual $R_1$ is calculated using Eq. (15):

$$R_1 = X - q_1 d \quad (15)$$

It can be mathematically proven that, if dividend X is a 32-bit integer, then residual $R_1$ is a 24-bit integer. It therefore follows that the calculations of step 504 retire eight bits of the dividend.

At step 506, the ALU is configured to calculate a second partial quotient ($q_2$) and a corresponding residual ($R_2$) that satisfy Eq. (16):

$$R_1 = q_2 d + R_2 \quad (16)$$

Note that Eq. (16) is analogous to Eq. (12), except that residual $R_1$ now serves as the dividend. Therefore, the above-described approach can now be applied to Eq. (16). More specifically, in a first sub-step of step 506, second partial quotient $q_2$ is calculated using Eq. (17):

$$q_2 = \frac{R_1^{(>>s)}}{d_1 + 1} \quad (17)$$

If $d_1 < 255$, then Eq. (17) expresses a 24/8-bit division operation, which can be performed, e.g., using an appropriate embodiment of method 400. If $d_1 = 255$, then the calculation corresponding to Eq. (17) can be implemented using a "binary shift-right by s+8 positions" operation. In a second sub-step of step 506, residual $R_2$ is calculated using Eq. (18):

$$R_2 = R_1 - q_2 d \quad (18)$$

It can be mathematically proven that, if residual $R_1$ is a 24-bit integer, then residual $R_2$ is a 16-bit integer. It therefore follows that, similar to the calculations of step 504, the calculations of step 506 retire eight bits.

At step 508, the ALU is configured to calculate a third partial quotient ($q_3$) and a corresponding residual ($R_3$) that satisfy Eq. (19):

$$R_2 = q_3 d + R_3 \quad (19)$$

Note that, similar to Eq. (16), Eq. (19) is also analogous to Eq. (12). Therefore, the calculation can similarly proceed in two sub-steps corresponding to Eqs. (20) and (21), respectively:

$$q_3 = \frac{R_2^{(>>s)}}{d_1 + 1} \quad (20)$$

$$R_3 = R_2 - q_3 d \quad (21)$$

It can be mathematically proven that, if residual $R_2$ is a 16-bit integer, then residual $R_3$ is an 8-bit integer.

At step 510, the ALU is configured to calculate a fourth partial quotient ($q_4$) and a corresponding residual ($R_4$) that satisfy Eq. (22):

$$R_3 = q_4 d + R_4 \quad (22)$$

The calculation of step 510 can proceed in two sub-steps corresponding to Eqs. (23) and (24), respectively:

$$q_4 = \frac{R_3^{(>>s)}}{d_1 + 1} \quad (23)$$

$$R_4 = R_3 - q_4 d \quad (24)$$

Note that Eq. (23) can be calculated using a single 16/8-bit division operation. It can be mathematically proven that residual $R_4$ satisfies the following inequality:

$$0 \leq R_4 < 2d \quad (25)$$

At step 512, the ALU is configured to generate true quotient Q and remainder R (see Eq. (2)) in accordance with Eqs. (26) and (27). More specifically, if $R_4 < d$, then Eqs. (26) are used:

$$Q = q_1 + q_2 + q_3 + q_4 \quad (26a)$$

$$R = R_4 \quad (26b)$$

where $q_1$, $q_2$, $q_3$, and $q_4$ are the partial quotients calculated at steps 504-510, respectively; and $R_4$ is the residual calculated at step 510. If $R_4 \geq d$, then Eqs. (27) are used:

$$Q = q_1 + q_2 + q_3 + q_4 + 1 \quad (27a)$$

$$R = R_4 - d \quad (27b)$$

In one embodiment, method 500 can be modified to include an additional step of determining the non-zero MSB position ($p_{MSB}$) in dividend X. This additional step can be performed, e.g., before step 504. Depending on the value of $p_{MSB}$, the following modifications can be made to the processing flow of method 500 shown in FIG. 5.

If $p_{MSB} \geq 24$, then the processing flow of method 500 remains unchanged.

If $24 > p_{MSB} \geq 16$, then the processing flow of method 500 can be changed as follows. Step 504 is omitted. Step 506 is modified so that $R_1 = X$. Step 512 is modified so that $q_1 = 0$.

If $16 > p_{MSB} \geq 8$, then the processing flow of method 500 is changed as follows. Steps 504 and 506 are omitted. Step 508 is modified so that $R_2=X$. Step 512 is modified so that $q_1=q_2=0$.

In one embodiment, step 308 of method 300 can be implemented using method 500 with the following parameters: d=3000 (=binary 00001011 10111000), $d_1$=10111011 (=decimal 187), and s=4.

Figure 6:
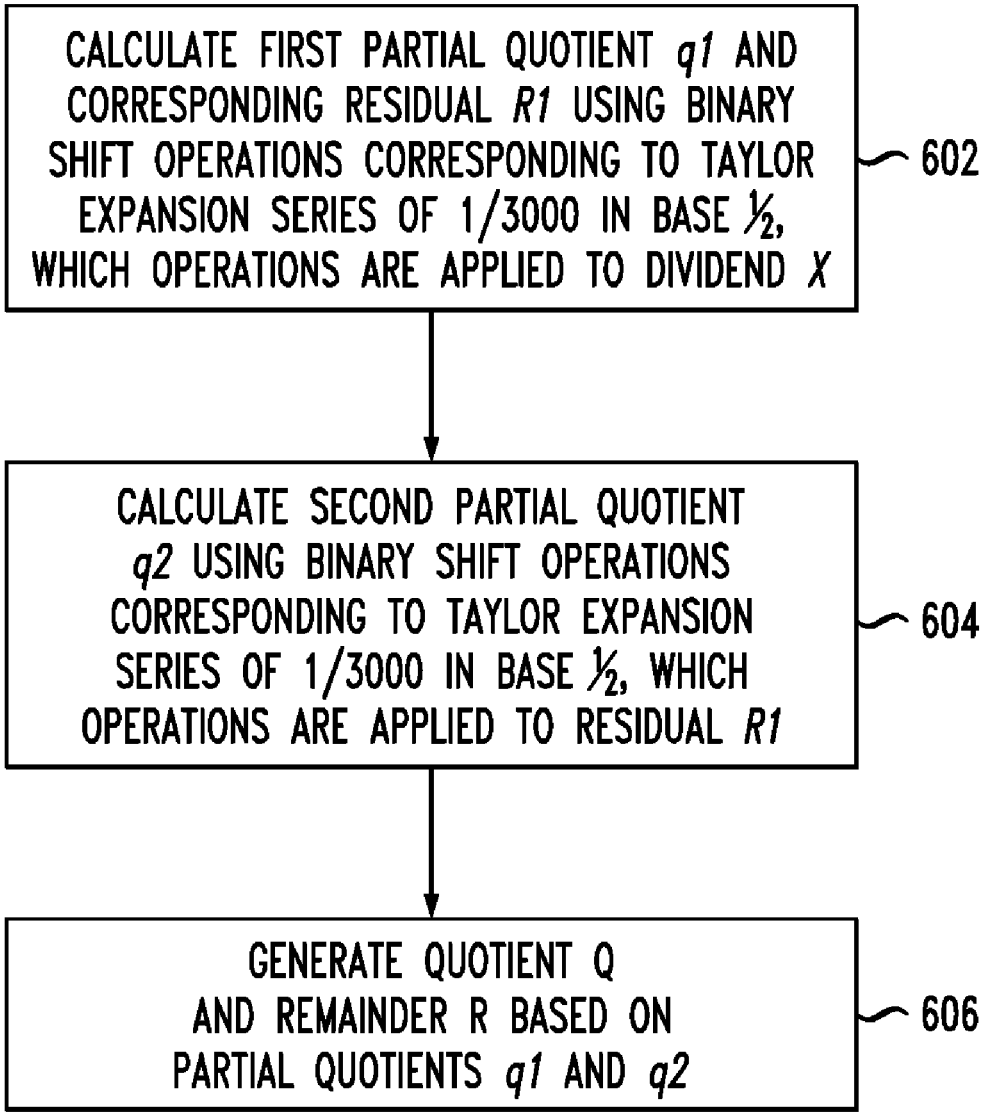
FIG. 6 shows a flowchart of a division method that can be used to implement a step of dividing a binary number by 3000 in the method shown in FIG. 3 according to one embodiment.

FIG. 6 shows a flowchart of a division method 600 that can be used to implement step 308 of method 300 according to another embodiment. Method 600 receives, as an input, a 32-bit dividend (X). Since method 600 is specifically designed to handle the divisor value of 3000, the true quotient (Q) and remainder (R) generated by this method satisfy Eq. (28):

$$X = 3000 \times Q + R \quad (28)$$

At step 602 of method 600, the ALU is configured to calculate a first partial quotient ($q_1$) and a corresponding residual ($R_1$) using Eqs. (29) and (30), respectively:

$$q_1 = X^{(>>12)} + X^{(>>14)} + X^{(>>16)} + X^{(>>17)} + X^{(>>18)} + X^{(>>20)} + X^{(>>21)} + X^{(>>26)} + X^{(>>27)} + X^{(>>30)} + X^{(>>31)} \quad (29)$$

$$R_1 = X - 3000 \times q_1 \quad (30)$$

where $X^{(>>n)}$ denotes the binary value obtained by applying a binary "shift-right by n positions" operation to dividend X. Eq. (29) is based on the Taylor expansion series of the value of 1/3000 in the base of ½, which is given by Eq. (31):

$$\frac{1}{3000} = 2^{-12} + 2^{-14} + 2^{-16} + 2^{-17} + 2^{-18} + 2^{-20} + 2^{-21} + 2^{-26} + 2^{-27} + 2^{-30} + 2^{-31} + \ldots \quad (31)$$

Since dividend X has at most 32 bits, the Taylor-expansion terms of the orders that are higher than those shown in Eq. (31) are truncated out. However, due to the truncation error, residual $R_1$ may be greater than 3000, and an appropriate correction of quotient $q_1$ is needed to obtain true quotient Q. This correction is calculated at step 604.

At step 604, the ALU is configured to calculate a second partial quotient ($q_2$) using Eqs. (32):

$$Z = R_1^{(<<1)} + R_1^{(>>1)} + R_1^{(>>3)} + R_1^{(>>4)} + R_1^{(>>5)} + R_1^{(>>7)} + R_1^{(>>8)} + R_1^{(>>13)} + R_1^{(>>14)} \quad (32a)$$

$$q_2 = (Z+4)^{(>>13)} \quad (32b)$$

where $R_1^{(<<1)}$ denotes the binary value obtained by applying a binary "shift-left by one position" operation to residual $R_1$; $R_1^{(>>n)}$ denotes the binary value obtained by applying a binary "shift-right by n positions" operation to residual $R_1$; $(Z+4)^{(>>13)}$ denotes the binary value obtained by applying a binary "shift-right by 13 positions" operation to the value of (Z+4).

As already indicated above, Eqs. (32) provide correction for the truncation error of Eq. (31). Eq. (32a) is based on the Taylor expansion series of the value of 8192/3000 in the base of ½, which is given by Eq. (33):

$$\frac{8192}{3000} = 2 + 2^{-1} + 2^{-3} + 2^{-4} + 2^{-5} + 2^{-7} + 2^{-8} + 2^{-13} + 2^{-14} + \ldots \quad (33)$$

Note that $8192 \equiv 2^{13}$. This means that Eq. (33) can be directly derived from Eq. (31) by multiplying the latter by the factor of $2^{13}$ and also removing some terms. Since $(8192)^{(>>13)}=1$, Eqs. (32) give a binary approximation of the value of $R_1/3000$. The latter becomes evident from Eq. (34):

$$\frac{R_1}{3000} = R_1 \frac{8192}{3000} \times \frac{1}{8192} = \left(R_1 \frac{8192}{3000}\right)^{(>>13)} \quad (34)$$

The value of 4 added to correction term Z in Eq. (32b) is an empirically determined offset that compensates for the truncation error of Eq. (33).

At step 606, the ALU is configured to generate true quotient Q and remainder R (see Eq. (28)) in accordance with Eqs. (35):

$$Q = q_1 + q_2 \quad (35a)$$

$$R = X - 3000 \times Q \quad (35b)$$

Since Eq. (32b) used at step 604 relies on an empirical offset value (=4), the validity of method 600 has been extensively tested and verified computationally for all possible values of the 32-bit dividend X. Because shift instructions execute faster than division instructions on most processors, the calculations corresponding to method 600 are typically advantageously faster than the calculations corresponding to a conventional 32/16-bit division operation.

As used in this specification, the term "arithmetic logic unit (ALU)" refers to a digital circuit that is a part of a central processing unit (CPU) or a computation engine of a device. A single CPU or computation engine may contain any number of ALUs. Most ALUs can perform the following operations: addition, subtraction, multiplication, division, bitwise logic operations (such as AND, NOT, OR, and XOR), and bit-shifting operations. To perform an operation, an ALU loads data from input registers. A control unit of the CPU then "tells" the ALU what operation it needs to perform on the data. The ALU then performs the operation and writes the result(s) into output registers. In principle, an ALU can be designed to perform any operation in a specified number of clock cycles, e.g., in a single clock cycle. The more complex the operation, the more complicated the logic circuitry that the ALU needs to have to be able to execute that operation as part of the CPU's or ALU's Instruction Set Architecture (ISA). An operation that is part of the ISA can usually be executed by issuing a corresponding single hardware (HW) instruction to the ALU.

Figure 7:
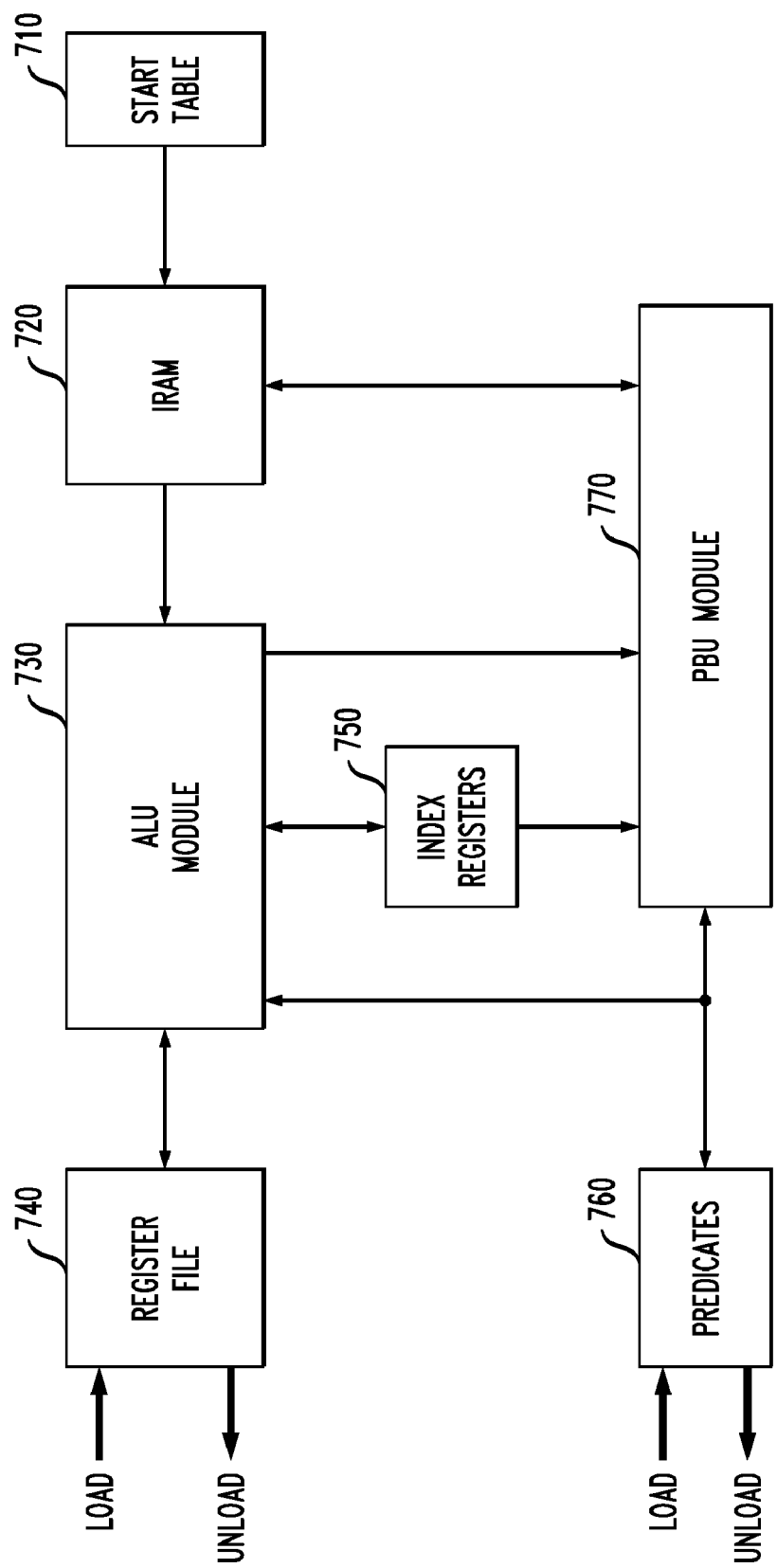
FIG. 7 shows a block diagram of a computation engine that can be used at a node of the communication system shown in FIG. 2 according to one embodiment.

FIG. 7 shows a block diagram of a computation engine 700 that can be used to implement methods 300, 400, 500, and 600 according to one embodiment. Computation engine 700 has a VLIW (very-long instruction word) architecture. In contrast to a RISC (reduced instruction set computing)-architecture instruction, which can typically specify only one operation, a VLIW-architecture instruction can specify several independent operations. Due to the VLIW architecture, computation engine 700 has capabilities that are comparable to those of a superscalar processor (e.g., for performing and completing more than one operation at a time). However, the VLIW hardware is not responsible for discovering opportunities to execute multiple operations concurrently, as is the case for superscalar processors. Instead, the long instruction word used in the VLIW architecture explicitly encodes concurrent operations.

In different embodiments, an ALU module 730 of computation engine 700 may have one or more (e.g., four) ALUs (individual ALUs not explicitly shown in FIG. 7). For each ALU in ALU module 730, a PBU (predicate and branch unit) module 770 usually has one PBU (individual PBUs not explicitly shown in FIG. 7). ALU module 730 receives VLIW instructions from an instruction RAM (IRAM) 720. Depending on the number of ALUs and PBUs in modules 730 and 770, different respective VLIW-instruction sizes may be used in different embodiments of computation engine 700.

For any given script, execution begins at the instruction address specified for that script in a start table 710 and continues, e.g., until an instruction having a stop-bit set has been executed. In one implementation, start table 710 is an array of entries indexed by script ID, with each entry containing the IRAM start address of the corresponding script that has been loaded into the start table by the corresponding configuration software. In one configuration, each of methods 300, 400, 500, and 600 is implemented as a corresponding script stored in IRAM 720 and indexed in start table 710.

ALU module 730 has access to an addressable memory 740 referred to as the register file. All ALUs of ALU module 730 can access memory 740 simultaneously under the same VLIW instruction. In one embodiment, each ALU has direct access to all of memory 740 and can read two operands, up to four bytes in length each, and write one result, up to four bytes in length, in a single VLIW instruction. In a representative embodiment, different ALU operations may use different operand lengths. For example, in one embodiment, an ALU multiplication operation may use two operands (multipliers), four bytes each. In contrast, an ALU division operation may use two operands, with one being two bytes (dividend) and the other being one byte (divisor). As a result, division operations with a dividend having a length longer than two bytes and/or a divisor having a length longer than one byte are implemented as scripts, e.g., corresponding to methods 300, 400, 500, and 600.

Both ALU module 730 and PBU module 770 can access predicates stored in a predicate memory 760. More specifically, predicate memory 760 has an array of Boolean values that can be used, e.g., by PBU module 770 in Boolean computations and jump instructions, and by ALU module 730 to gate the execution of VLIW instructions. In one embodiment, each PBU of PBU module 770 can read two predicate values and modify a third in a single VLIW instruction. In addition, each ALU of ALU module 730 can access one predicate value to gate the corresponding VLIW instruction.

An array 750 of index registers is used to store pointers to the values stored in register file 740. As with register file 740, each ALU of ALU module 730 can read up to two index registers as operands and write a result into one index register in a single VLIW instruction. The index registers of array 750 are also used by PBU branch instructions, e.g., to specify the corresponding target branch addresses.

In operation, register file 740 and predicate memory 760 are loaded with input values provided by the hardware client (e.g., a header-compression module of the corresponding host device, the module not explicitly shown in FIG. 7) that is going to utilize the services of computation engine 700. During the execution of the invoked script, computation engine 700 modifies the values stored in register file 740 and predicate memory 760 in accordance with the script. The modified values are then unloaded from register file 740 and predicate memory 760 back to the hardware client. In effect, different scripts act as subroutines for the hardware client, with register file 740 and predicate memory 760 providing appropriate parameters for the subroutines and the means for inputting and outputting data.

As used in the claims, the term "8-bit integer" refers to a binary value for which $p_{MSB} \leq 7$, where $p_{MSB}$ denotes the non-zero MSB position, with the bit positions being numbered in the ascending order starting from the least significant bit (position number 0). The term "16-bit integer" refers to a binary value for which $7 < p_{MSB} \leq 15$. The term "24-bit integer" refers to a binary value for which $15 < p_{MSB} \leq 23$. The term "32-bit integer" refers to a binary value for which $23 < p_{MSB} \leq 31$.

While this invention has been described with reference to illustrative embodiments, this description is not intended to be construed in a limiting sense.

For example, methods 300, 400, 500, and 600 have been described above in reference to timestamp compression in communication devices. One of ordinary skill in the art will appreciate that various embodiments of methods 300, 400, and 500 can also be used to implement an M/N-bit division operation using a corresponding plurality of 16/8-bit division operations, where M and N are any pair of integer multiples of 8, where $M \geq N$, $M \geq 16$, $N \geq 8$ (except for M/N=16/8). For example, M/N may belong to a set that includes 32/16, 32/8, 24/16, 24/8, 16/16, etc. The values of M>32 are also contemplated. One of ordinary skill in the art will also appreciate that various embodiments of the disclosed division algorithms can be appropriately modified to work using any suitable plurality of P/Q-bit division operations, where $N \leq M$, $P \leq M$, $Q < P$, and $Q < N$.

Although method 600 has been described in reference to the divisor value of 3000, similar principles can be used to devise a custom division method for any divisor value d. More specifically, such a custom division method will rely on the Taylor expansion series of 1/d in the base of ½, and then use the orders of said Taylor expansion series to determine the shift numbers for the corresponding plurality of binary-shift operations analogous to those shown in Eqs. (29) and (32).

Various modifications of the described embodiments, as well as other embodiments of the invention, which are apparent to persons skilled in the art to which the invention pertains are deemed to lie within the principle and scope of the invention as expressed in the following claims.

The present inventions may be embodied in other specific apparatus and/or methods. The described embodiments are to be considered in all respects as only illustrative and not restrictive. In particular, the scope of the invention is indicated by the appended claims rather than by the description and figures herein. All changes that come within the meaning and range of equivalency of the claims are to be embraced within their scope.

The description and drawings merely illustrate the principles of the invention. It will thus be appreciated that those of ordinary skill in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The functions of the various elements shown in the figures, including any functional blocks labeled as "processors" or described as having a "processors" as a component thereof, may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included.

Although the embodiments have been described in the context of calculation of values, alternative embodiments exist in the context of generation of signals. For example, any binary value, operand, or result can be implemented as a set of electrical signals, each having two possible magnitudes, e.g., a "high" magnitude to represent a binary one, and a "low" magnitude to represent a binary zero. In the context of such electrical signals, "calculations" become signal-processing techniques that generate electrical signals decodable or interpretable as binary values.

It should be appreciated by those of ordinary skill in the art that any block diagrams herein represent conceptual views of illustrative circuitry embodying the principles of the invention. Similarly, it will be appreciated that any flowcharts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, each of the terms "compatible," "in accordance with," and "in compliance with" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they formally fall within the scope of the claims.

What is claimed is:

1. An apparatus, comprising:
an instruction memory; and
a processing module that is configured, using a sequence of instructions from the instruction memory, to:
generate a first partial quotient and a first residual using a first plurality of binary-shift operations, each applied to a first operand, wherein each of said binary-shift operations corresponds to a term in a Taylor expansion series of a reciprocal second operand in a base of ½; and
generate a true quotient for a division operation, in which the first operand is the dividend and the second operand is the divisor, based on the first partial quotient.

2. The apparatus of claim 1, wherein:
the first operand is 32 bits long; and
the second operand is 24, 16, or 8 bits long.

3. The apparatus of claim 1, further comprising:
a compression module configured to compress a first data packet to generate a second data packet; and
a transmitter configured to transmit the second data packet via a communication link, wherein:
the first data packet is a part of a data stream that is being transmitted over the communication link;
the first operand is a timestamp from the first data packet; and
the second operand is a stride corresponding to the data stream.

4. The apparatus of claim 1, wherein the instruction memory has:
a first sequence of instructions, which is used by the processing module for the generation of the true quotient when the second operand is 8 bits long;
a second sequence of instructions, which is used by the processing module for the generation of the true quotient when the second operand is 16 bits long; and
a third sequence of instructions, which is used by the processing module for the generation of the true quotient when the second operand is decimal 3000.

5. The apparatus of claim 1, wherein:
each of the binary-shift operations produces a corresponding shifted value; and
the first partial quotient is a sum of said shifted values.

6. The apparatus of claim 1, wherein the second integer is decimal 3000.

7. The apparatus of claim 1, wherein the processing module is further configured to generate a second partial quotient and a second residual using a second plurality of binary-shift operations applied to the first residual, wherein each of said binary-shift operations corresponds to a term in the Taylor expansion series, wherein the true quotient is further based on the second partial quotient.

8. The apparatus of claim 7, wherein:
each of the binary-shift operations of the second plurality produces a corresponding shifted value; and
the processing module is further configured to:
generate a sum of said shifted values;
generate an offset sum by adding an offset value to the sum of said shifted values; and apply a binary right shift to the offset sum to generate the second partial quotient.

9. The apparatus of claim 8, wherein:
the offset value is four; and
the binary right shift is by 13 positions.

10. A machine-implemented method of processing data, the method comprising:
the machine generating a first partial quotient and a first residual using a first plurality of binary-shift operations, each applied to a first operand, wherein each of said binary-shift operations corresponds to a term in a Taylor expansion series of a reciprocal second operand in a base of ½; and
the machine generating a true quotient for a division operation, in which the first operand is the dividend and the second operand is the divisor, based on the first partial quotient.

11. The method of claim 10, wherein:
each of the binary-shift operations produces a corresponding shifted value; and
the first partial quotient is a sum of said shifted values.

12. The method of claim 10, wherein the second integer is decimal 3000.

13. The method of claim 10, wherein the first plurality of binary-shift operations comprises at least a subset of the set consisting of:
a right shift by 12 binary positions;
a right shift by 14 binary positions;
a right shift by 16 binary positions;
a right shift by 17 binary positions;
a right shift by 18 binary positions;
a right shift by 20 binary positions;
a right shift by 21 binary positions;
a right shift by 26 binary positions;
a right shift by 27 binary positions;
a right shift by 30 binary positions; and
a right shift by 31 binary positions.

14. The method of claim 10, further comprising generating a second partial quotient and a second residual using a second plurality of binary-shift operations applied to the first residual, wherein each of said binary-shift operations corresponds to a term in the Taylor expansion series, wherein the true quotient is further based on the second partial quotient.

15. The method of claim 14, wherein the second plurality of binary-shift operations comprises at least a subset of the set consisting of:
a left shift by 1 binary position;
a right shift by 1 binary position;
a right shift by 3 binary positions;
a right shift by 4 binary positions;
a right shift by 5 binary positions;
a right shift by 7 binary positions;
a right shift by 8 binary positions;
a right shift by 13 binary positions; and
a right shift by 14 binary positions.

16. The method of claim 14, wherein:
each of the binary-shift operations of the second plurality produces a corresponding shifted value; and
the step of generating the second partial quotient comprises:
generating a sum of said shifted values;
generating an offset sum by adding an offset value to the sum of said shifted values; and
generating the second partial quotient by applying a binary right shift to the offset sum, wherein:
the offset value is four; and
the binary right shift is by 13 positions.

17. The method of claim 10, further comprising:
compressing a first data packet to generate a second data packet; and
transmitting the second data packet via a communication link, wherein:
the first data packet is a part of a data stream that is being transmitted over the communication link;
the first operand is a timestamp from the first data packet; and
the second operand is a stride corresponding to the data stream.

18. The method of claim 10, further comprising:
inspecting the second operand to determine its type; and
based on the determined type, selecting a division algorithm from a plurality of different division algorithms; and
generating the true quotient using the selected division algorithm.

19. The method of claim 18, wherein the plurality of division algorithms comprises:
a first division algorithm to be selected when the second operand is 8 bits long;
a second division algorithm to be selected when the second operand is 16 bits long; and
a third division algorithm to be selected when the second operand is decimal 3000.

20. The method of claim 10, wherein each of the first partial quotient, the first residual, the first operand, the second operand, the reciprocal second operand, and the true quotient is a respective set of electrical signals generated by the machine.

* * * * *